United States Patent [19]
Kanazawa et al.

[11] 3,986,151
[45] Oct. 12, 1976

[54] ELECTROMECHANICAL BRANCHING FILTER

[75] Inventors: Seiichiro Kanazawa; Takeshi Yano, both of Tokyo, Japan

[73] Assignee: Nippon Electric Company, Ltd., Tokyo, Japan

[22] Filed: May 7, 1975

[21] Appl. No.: 575,548

[30] Foreign Application Priority Data
May 7, 1974 Japan............................. 49-49681

[52] U.S. Cl..................................... 333/71; 333/72
[51] Int. Cl.² ..................... H03H 9/26; H03H 9/32; H03H 9/14; H01L 41/08
[58] Field of Search............................ 333/71, 72, 6

[56] References Cited
UNITED STATES PATENTS

| | | |
|---|---|---|
| 2,955,267 | 10/1960 | Mason ................................. 333/71 |
| 3,142,027 | 7/1964 | Albsmeier et al..................... 333/72 |
| 3,534,297 | 10/1970 | Onoe et al. ............................. 333/6 |

*Primary Examiner*—Alfred E. Smith
*Assistant Examiner*—Marvin Nussbaum
*Attorney, Agent, or Firm*—Sughrue, Rothwell, Mion, Zinn, and Macpeak

[57] ABSTRACT

An electromechanical branching filter capable of branching an input electrical signal into two output signals having different frequency components. It includes a wide bandpass filter section and a narrow bandpass filter section, both sections being mechanically connected to a common input transducer through coupling means including a coupler whose coupling coefficient is in the range of ±30 % of the geometric mean value of the fractional bandwidths of the two filter sections.

1 Claim, 9 Drawing Figures

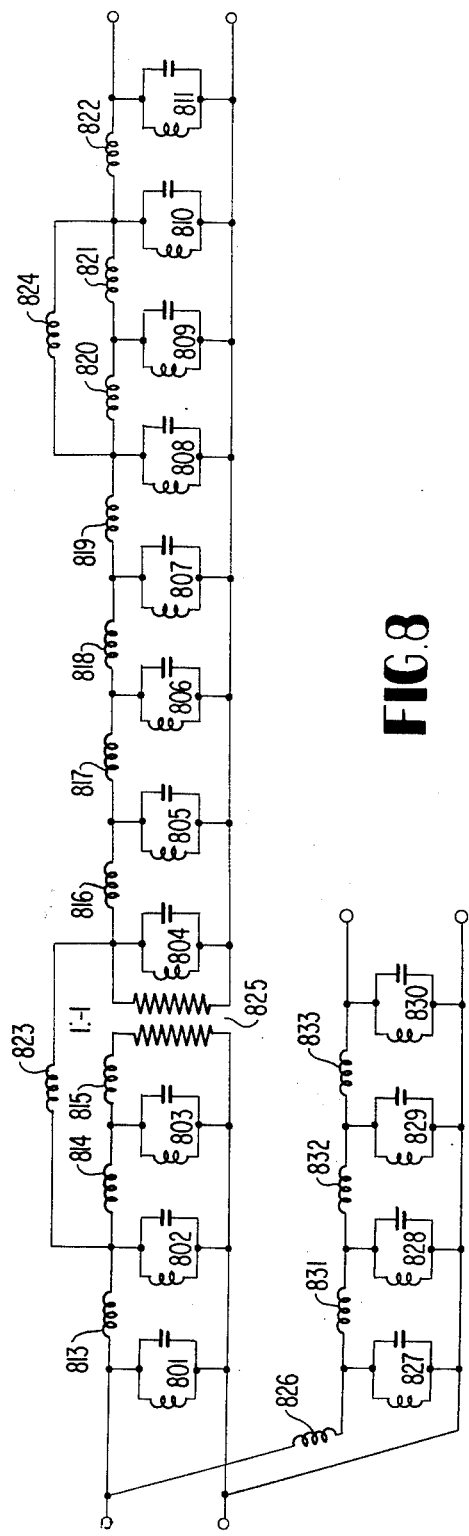

ELECTROMECHANICAL BRANCHING FILTER

BACKGROUND OF THE INVENTION

1. Field of the Invention

The present invention relates to electromechanical branching filters of the type comprising a mechanical vibration system which is capable of branching an input electrical signal into two output electrical signals having different frequency components or of synthesizing two signals of different frequency components into one output signal. More particularly, the invention relates to an electromechanical branching filter comprising electromechanical, wide and narrow bandpass filters, the passband center frequencies of which are adjacent to each other.

2. Description of the Prior Art

One recent trend in the field of carrier telephone transmission systems has been toward the realization of higher multiplexing ratios which permit economical transmission of a greater number of speech channel signals. This has induced the need for filters of smaller dimensions, such as electromechanical branching filters comprising a plurality of mechanically coupled electromechanical filters. A typical filter of this type is disclosed in the U.S. Pat. No. 2,955,267, entitled "Electromechanical Torsional Band Pass Wave Filter", granted to Warren P. Mason on Oct. 4, 1960. In the Mason arrangement, electromechanical filters having different passbands are linked to a common transducer designed to have a passband wide enough to cover all the passbands of the individual electromechanical filters. In such construction, however, the common transducer operates as an idle element in that it does not directly contribute to attenuation of signal energy, since its passband covers all the various passbands involved.

SUMMARY OF THE INVENTION

Therefore, it is an object of the present invention to provide an electromechanical branching filter which eliminates the need for such prior art idle element.

With this and other objects in view, the present invention provides an electromechanical branching filter comprising: an input transducer for branching an input signal having a certain spread on the frequency axis into two output signals having different frequency components; a first output transducer; a first plurality of resonators linked to each other by couplers between the input transducer and the first output transducer to form a first electromechanical filter; a second output transducer; and at least one second resonator linked to each other by couplers between the input transducer and the second output transducer to form a second electromechanical filter, wherein the center frequencies of the passbands of the first and second electromechanical filters are adjacent to each other, the ratio of the passband widths of the two electromechanical filters is larger than about 10, and the first and second electromechanical filters are linked to each other by a coupler, the coupling coefficient of which is in the range of ±30 percent of the geometric mean value of the fractional bandwidths of the two electromechanical filters.

These and other objects, features and advantages of the invention will become more apparent from the following description when read in conjunction with the accompanying drawings.

BRIEF DESCRIPTION OF THE DRAWINGS

FIG. 8 is an equivalent circuit of a pole-type branching filter.

FIG. 9 is a perspective view of a further form of an electromechanical branching filter embodying the invention, which comprises torsional vibration mode resonators to form the equivalent circuit of FIG. 8.

DETAILED DESCRIPTION OF THE PREFERRED EMBODIMENTS

The circuit shown in FIG. 2, which is the equivalent circuit of the electromechanical branching filter shown in FIG. 1, will be described by referring to FIGS. 3 to 6. FIG. 3 shows a circuit diagram of a typical low-pass filter which serves as the fundamental of an electromechanical, wide bandpass filter. The constants of this filter circuit are as follows:

| | |
|---|---|
| $R_1$ : 1.0 (ohm) | $R_2$ : 1.0 (ohm) |
| 301 : 0.961973829 (henry) | 302 : 1.48017326 (farad) |
| 303 : 1.95274209 (henry) | 304 : 1.73318939 (farad) |
| 305 : 2.06674136 (henry) | 306 : 1.77569342 (farad) |
| 307 : 2.08646426 (henry) | |

Figure 5:
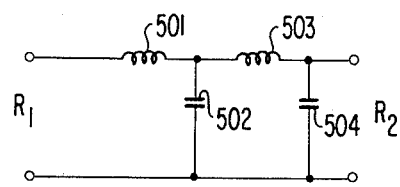

FIG. 5 shows a circuit diagram of a typical low-pass filter which serves as the fundamental of an electromechanical, narrow bandpass filter. The constants of this filter are as follows:

| | |
|---|---|
| $R_1$ : 1.0 (ohm) | $R_2$ : 1.2221638 (ohm) |
| 501 : 0.9336442 (henry) | 502 : 1.2923128 (farad) |
| 503 : 1.5794170 (henry) | 504 : 0.7635186 (farad) |

Figure 3:
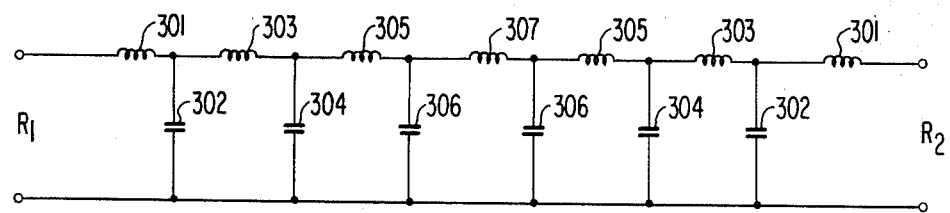
FIGS. 3 and 5 are circuit diagrams of typical low-pass filters.
Figure 4:
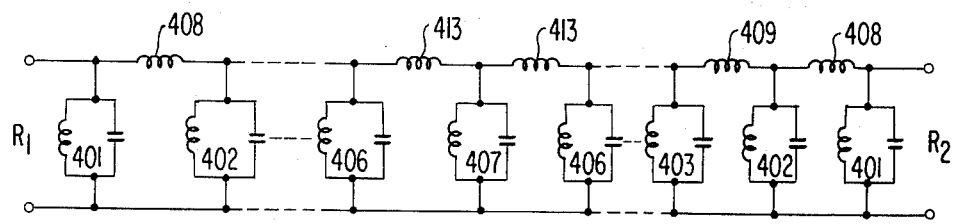
FIGS. 4 and 6 are equivalent circuits of electromechanical, wide and narrow bandpass filters derived from the circuits of FIGS. 3 and 5, respectively.

The circuit shown in FIG. 3 is transformed by bandpass transformation into a bandpass filter configuration with a center frequency of 113.9 kHz and a passband width of 3.27 kHz. Then, by further transforming it by gyrator conversion, an equivalent circuit of the electromechanical, wide bandpass filter shown in FIG. 4 is obtained. The constants of this circuit are as follows:

| $R_1$ : 1.0 (ohm) | $R_2$ : 1.0 (ohm) |
|---|---|
| 401L: 4.2804×10$^{-8}$ (henry) | 401C: 4.6820×10$^{-5}$ (farad) |
| 402L: 4.3558×10$^{-8}$ (henry) | 402C: 4.6820×10$^{-5}$ (farad) |
| 403L: 4.3177×10$^{-8}$ (henry) | 403C: 4.6820×10$^{-5}$ (farad) |
| 404L: 4.3101×10$^{-8}$ (henry) | 404C: 4.6820×10$^{-5}$ (farad) |
| 405L: 4.3073×10$^{-8}$ (henry) | 405C: 4.6820×10$^{-5}$ (farad) |
| 406L: 4.3062×10$^{-8}$ (henry) | 406C: 4.6820×10$^{-5}$ (farad) |
| 407L: 4.3059×10$^{-8}$ (henry) | 407C: 4.6820×10$^{-5}$ (farad) |

-continued

| $R_1$ : 1.0 (ohm) | $R_2$ : 1.0 (ohm) |
|---|---|
| 408 : $1.7348 \times 10^{-8}$ (henry) | 409 : $2.4716 \times 10^{-6}$ (henry) |
| 410 : $2.6745 \times 10^{-6}$ (henry) | 411 : $2.7515 \times 10^{-6}$ (henry) |
| 412 : $2.7850 \times 10^{-6}$ (henry) | 413 : $2.7983 \times 10^{-6}$ (henry) |

Figure 6:
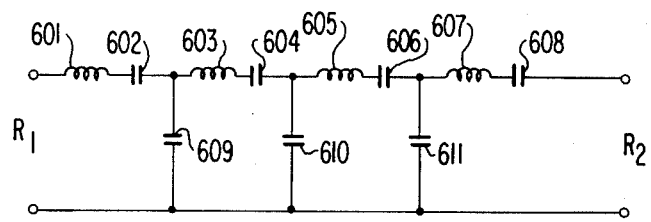

The circuit shown in FIG. 5 is transformed by bandpass transformation into a bandpass filter configuration with a center frequency of 115.85 kHz and a passband width of 100 Hz. Then, by further transforming it through gyrator conversion, an equivalent circuit of the electromechanical, narrow bandpass filter shown in FIG. 6 is obtained. The constants of this circuit are as follows:

| $R_1$ : 1.0 (ohm) | $R_2$ : 1.0 (ohm) |
|---|---|
| 601 : $9.0009 \times 10^{-4}$ (henry) | 602 : $2.1002 \times 10^{-9}$ (farad) |
| 603 : $9.0009 \times 10^{-4}$ (henry) | 608 : $2.1002 \times 10^{-9}$ (farad) |
| 605 : $9.0009 \times 10^{-4}$ (henry) | 604 : $2.1023 \times 10^{-9}$ (farad) |
| 607 : $9.0009 \times 10^{-4}$ (henry) | 606 : $2.1023 \times 10^{-9}$ (farad) |
| 609 : $1.6170 \times 10^{-6}$ (farad) | 610 : $2.1037 \times 10^{-6}$ (farad) |
| 611 : $1.6170 \times 10^{-6}$ (farad) | |

The circuit shown in FIG. 6 is transformed by gyrator conversion and Norton conversion and then is branchedly connected to the circuit shown in FIG. 4 to comprise an equivalent circuit (FIG. 2) of the electromechanical branching filter of the invention. The constants of this circuit are as follows:

| $R_1$ : 1.0 (ohm) | $R_2$ : 1.0 (ohm) | $R_3$ : 19.224 (ohm) |
|---|---|---|
| 201L : $4.2804 \times 10^{-8}$ (henry) | 201C : $4.6820 \times 10^{-5}$ (farad) | 209 : $1.7348 \times 10^{-8}$ (henry) |
| 202L : $4.3558 \times 10^{-8}$ (henry) | 202C : $4.6820 \times 10^{-5}$ (farad) | 210 : $2.4716 \times 10^{-6}$ (henry) |
| 203L : $4.3177 \times 10^{-8}$ (henry) | 203C : $4.6820 \times 10^{-5}$ (farad) | 211 : $2.6745 \times 10^{-6}$ (henry) |
| 204L : $4.3101 \times 10^{-8}$ (henry) | 204C : $4.6820 \times 10^{-5}$ (farad) | 212 : $2.7515 \times 10^{-6}$ (henry) |
| 205L : $4.3073 \times 10^{-8}$ (henry) | 205C : $4.6820 \times 10^{-5}$ (farad) | 213 : $2.7850 \times 10^{-6}$ (henry) |
| 206L : $4.3062 \times 10^{-8}$ (henry) | 206C : $4.6820 \times 10^{-5}$ (farad) | 214 : $2.7983 \times 10^{-6}$ (henry) |
| 207L : $4.3059 \times 10^{-8}$ (henry) | 207C : $4.6820 \times 10^{-5}$ (farad) | |
| 208 : $6.1318 \times 10^{-8}$ (henry) | | 218L : $4.0375 \times 10^{-8}$ (henry) |
| 215L : $4.0643 \times 10^{-8}$ (henry) | 215C : $4.6820 \times 10^{-5}$ (farad) | 218C : $4.6820 \times 10^{-5}$ (farad) |
| 216L : $4.0416 \times 10^{-8}$ (henry) | 216C : $4.6820 \times 10^{-5}$ (farad) | 219 : $8.4112 \times 10^{-8}$ (henry) |
| 217L : $4.0416 \times 10^{-8}$ (henry) | 217C : $4.6820 \times 10^{-5}$ (farad) | 220 : $8.0443 \times 10^{-8}$ (henry) |
| | | 221 : $8.4112 \times 10^{-8}$ (henry) |

Figure 1:
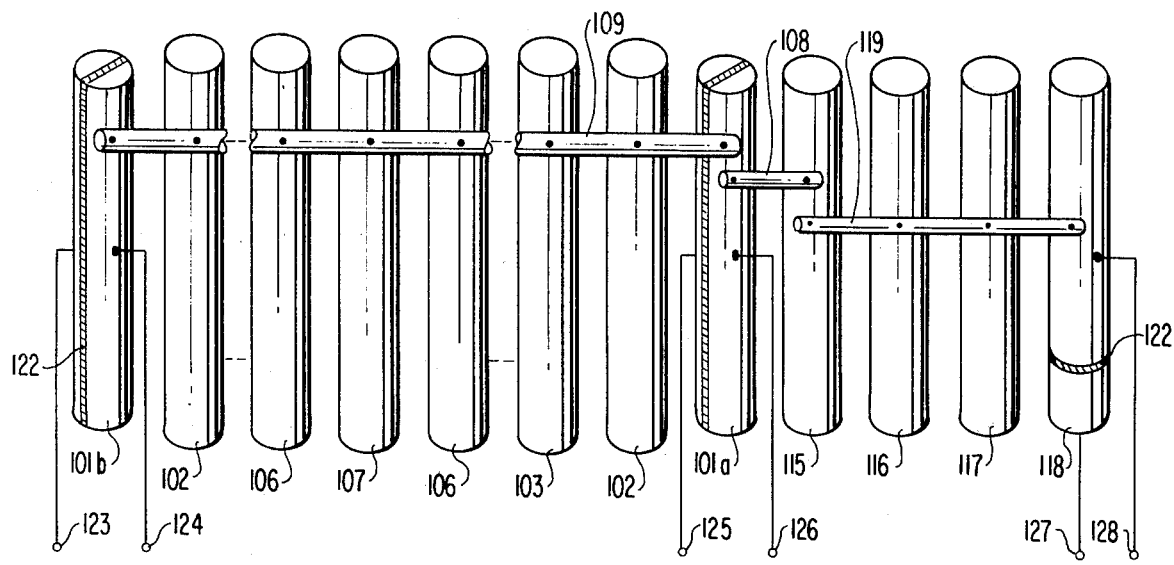
FIG. 1 is a perspective view showing the construction of an electromechanical branching filter of the present invention comprising torsional vibration mode resonators and longitudinal vibration mode couplers.
Figure 2:
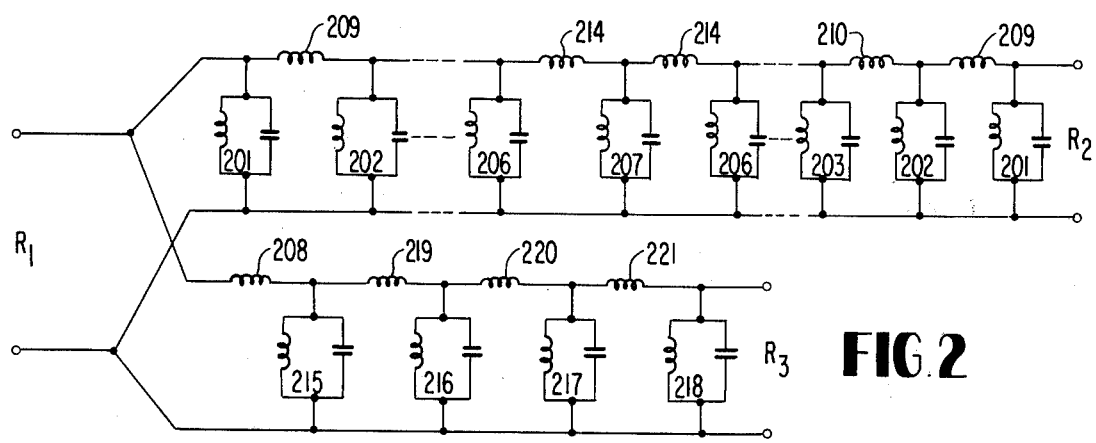
FIG. 2 is an equivalent circuit of the electromechanical branching filter shown in FIG. 1.

In FIG. 2, parallel resonant circuits 201, 218, 202 to 207, and 215 to 217 can be realized by appropriate transducers and resonators, respectively, and coils 208 to 214 and 219 to 221 can be realized by appropriate couplers. Thus, the equivalent circuit of FIG. 2 can be realized in the form of a mechanical vibration system whereby the electromechanical branching filter shown in FIG. 1 is provided.

Referring to FIG. 1, the electromechanical branching filter depicted includes cylindrical, torsional vibration mode resonators 102 to 107 which are linked to each other in chain between a common side transducer 101a and a separation side transducer 101b by a longitudinal vibration mode coupler 109 to form a wide-band branch. The branching filter further includes cylindrical, torsional vibration mode resonators 116 and 117 which are linked in chain between a resonator 115 and a separation side transducer 118 by a longitudinal vibration mode coupler 119 to form a narrow-band branch. The wide-band and narrow-band branches are mechanically connected to each other by a coupler 108, the coupling coefficient of which is equal to the geometric mean value of the fractional bandwidths of the two branches. Generally, the coupling coefficient of a coupler depends on the diameter thereof and the position on the resonator where it is fixed thereto. The optimization of the coupling coefficient is therefore achieved by the suitable choice of the diameter and the fixing position. The coupling coefficient of the coupler 108 need not be equal to the mentioned geometric mean value but may be in the range of ±30 percent. The common side transducer 101a and the separation side transducers 101b and 118 are of the construction comprising a piezoelectric ceramic element made of lead titanate zirconate or the like which has been subjected to a polarization treatment, the ceramic element being sandwiched between two metal members. An alternating electric field is applied to the ceramic element through common side electric terminals 125 and 126 so that the transducer 101a will vibrate in the torsional vibration mode. It is noted here that the resonators 102 and 107 and 115 to 117 are composed of an alloy called Elinnvar made of iron, nickel, titanium and chromium, and that supporting means for these resonators are omitted in FIG. 1 for simplicity of illustration (As for the supporting means, reference is made to FIG. 9 and the description thereof.

Now, assume that an electric energy is supplied to the common side electric terminals 125 and 126. Then this energy is converted into a mechanical vibration energy by the common side transducer 101a. The mechanical vibration energy is branched to the wide-band branch in which it is transmitted through the resonators 102–107 by way of the coupler 109, as well as to the narrow-band branch in which it is transmitted through the resonators 115–117 in sequence by way of the couplers 108 and 119. The branched mechanical vibration energy is converted back into an electrical energy by the separation side transducers 101b and 118.

Figure 7:
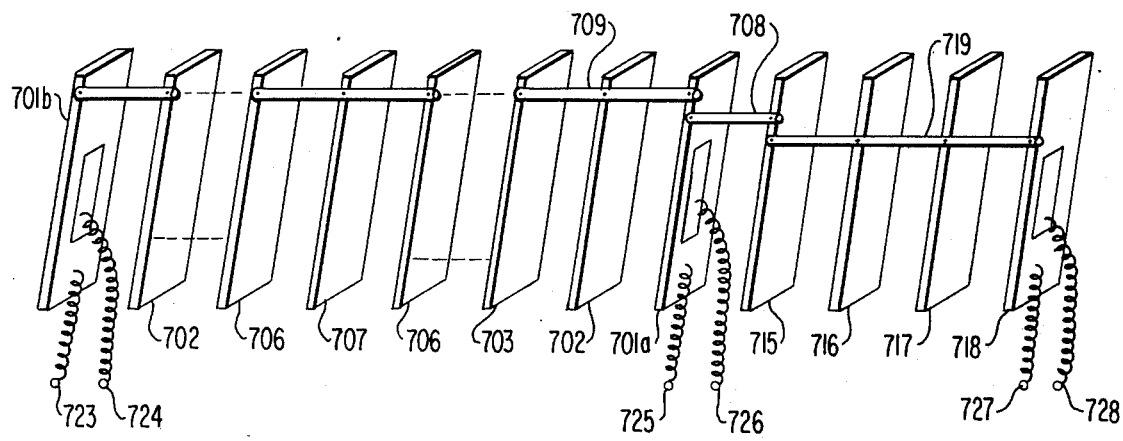
FIG. 7 is a perspective view of another form of an electromechanical branching filter embodying the invention, which includes fundamental bending-mode resonators to form the equivalent circuit of FIG. 2.

In the embodiment of FIG. 7, there are provided fundamental bending-mode resonators 702 to 707 and 716 and 717 which are linked to each other in chain by longitudinal vibration mode couplers 709 and 719, respectively, between a common side transducer 701a capable of fundamental bending-mode and a separation side transducer 701b, and between a resonator 715 and a separation side transducer 718, respectively, whereby a wide-band branch and a narrow-band branch are formed. These branches are connected by a coupler 708, the coupling coefficient of which is equal to, or may be in the range of ±30 percent of the geometric mean value of the fractional bandwidths of the two branches, as in the embodiment illustrated in FIG. 1. As in the embodiment of FIG. 1, supporting means for these resonators are not shown in FIG. 7 for the simplicity of illustration.

An exemplary non-pole type electromechanical branching filter of the invention has been described. The invention will further be described in reference to a pole type electromechanical branching filter shown in FIG. 8.

In FIG. 8, parallel resonant circuits 801, 811, 830, 802 to 810, and 827 to 829 can be realized by appropriate transducers and resonators, respectively, and coils 813 to 824, 826, and 831 to 833 can be realized by appropriate couplers. A transformer 825 is provided having a transformation ratio of 1:-1 which indicates a reverse phase relationship between the parallel resonant circuits 803 and 804. By realizing this equivalent circuit with a mechanical vibration system, an electromechanical branching filter as shown in FIG. 9 is obtained similarly to the embodiment shown in FIG. 1.

The arrangement shown in FIG. 9 includes torsional vibration mode resonators 902 to 910 and 928 to 929 which are linked to each other in chain by longitudinal vibration mode couplers 913 to 924, and 931 to 933, respectively, between a common side transducer 901 and a separation side transducer 911, and between a resonator 927 and a separation side transducer 930, respectively, whereby a wide-band branch and a narrow-band branch are formed. These branches are connected by a coupler 926 whose coupling coefficient is equal to or may be in the range of ±30 percent of the geometric mean value of the fractional bandwidths of the two branches, as in the embodiment shown in FIG. 1. The coupler 915 is mounted to the inside of one of the resonators (such as resonator 904) in order to establish a reverse-phase coupling between the resonators 903 and 904. The resonators 903 and 909 have recessed portions to avoid their contact with the couplers 923 and 924, respectively. The resonators are disposed in a straight line for easy support. Supporting wires 934 support these resonators in the center thereof which is the node of torsional vibration of each resonator.

The invention has been described in detail in reference to its preferred embodiments of the electromechanical branching filter comprising torsional vibration mode resonators and fundamental bending-mode resonators. According to the invention, longitudinal vibration mode resonators may be used instead of torsional vibration mode resonators or fundamental bending-mode resonators. Also, the wide-band branch and the narrow-band branch may be either of non-pole type or of pole type.

What is claimed is:

1. An electromechanical branching filter comprising:
   an input transducer;
   a first plurality of resonators;
   a first output transducer;
   means mechanically interconnecting said input transducer, said first plurality of resonators and said first output transducer in a vibration transmitting relationship to form a first broad-bandwidth bandpass filter section;
   at least one second resonator;
   a second output transducer;
   means mechanically interconnecting said at least one second resonator and said second output transducer in a vibration transmitting relationship to form a second narrow-bandwidth bandpass filter section, the bandwidth of said first bandpass filter section being more than ten times greater than that of said second bandpass filter, and the passbands of said first and second filter sections being adjacent each other so that said input transducer need not have a broad band frequency response; and
   means mechanically interconnecting said at least one second resonator and said input transducer in a vibration transmitting relationship with a coupling coefficient in the range of ±30 percent of the geometric mean value of the fractional bandwidths of said first and second bandpass filter sections.

* * * * *

UNITED STATES PATENT AND TRADEMARK OFFICE
CERTIFICATE OF CORRECTION

PATENT NO. : 3,986,151
DATED : October 12, 1976
INVENTOR(S) : Seiichiro Kanazawa and Takeshi Yano It is certified that error appears in the above-identified patent and that said Letters Patent are hereby corrected as shown below:

Column 4, line 19 - delete "102 and 107" and insert --102 to 107-- line 20 - delete "Elinnvar" and insert -- Elinvar --

Signed and Sealed this

Fifteenth Day of March 1977

[SEAL]

Attest:

RUTH C. MASON
Attesting Officer

C. MARSHALL DANN
Commissioner of Patents and Trademarks